(12) United States Patent
Kwak et al.

(10) Patent No.: US 10,529,640 B2
(45) Date of Patent: Jan. 7, 2020

(54) APPARATUS FOR MANUFACTURING A THERMOELECTRIC MODULE

(71) Applicants: Hyundai Motor Company, Seoul (KR); Kia Motors Corporation, Seoul (KR)

(72) Inventors: Jin Woo Kwak, Gyeongsan-si (KR); Kyong Hwa Song, Seoul (KR); Byung Wook Kim, Seongnam-si (KR); In Woong Lyo, Suwon-si (KR); Han Saem Lee, Seoul (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 191 days.

(21) Appl. No.: 15/714,450

(22) Filed: Sep. 25, 2017

(65) Prior Publication Data

US 2018/0122719 A1 May 3, 2018

(30) Foreign Application Priority Data

Oct. 27, 2016 (KR) .......................... 10-2016-0141155

(51) Int. Cl.
*B23P 19/00* (2006.01)
*H01L 23/34* (2006.01)
(Continued)

(52) U.S. Cl.
CPC ........ *H01L 23/345* (2013.01); *H01L 23/5328* (2013.01); *H01L 29/401* (2013.01);
(Continued)

(58) Field of Classification Search
CPC . H01L 23/345; H01L 23/5328; H01L 29/401; H01L 35/22; H01L 35/30; H01L 35/32; H01L 35/34
See application file for complete search history.

(56) References Cited

U.S. PATENT DOCUMENTS 4,643,663 A * 2/1987 Bowles ................... B29C 43/04
425/406
6,399,918 B1 * 6/2002 Komine ................... B29C 43/18
100/295

(Continued)

FOREIGN PATENT DOCUMENTS

JP 2006278385 A 10/2006
KR 101184155 B1 9/2012

*Primary Examiner* — Paul D Kim
(74) *Attorney, Agent, or Firm* — Slater Matsil, LLP

(57) ABSTRACT

An apparatus for manufacturing a thermoelectric module is provided. The thermoelectric module includes thermoelectric pellets, first electrodes, second electrodes, and an insulating substrate. The apparatus includes a fixing tray to which the thermoelectric module is fixed, a first die including a first heating member configured to heat a first adhesive layer, which is interposed between the thermoelectric pellets and the first electrodes. The fixing tray is mounted on the first die such that the insulating substrate faces the first heating member. A second die includes a second heating member configured to heat a second adhesive layer, which is interposed between the thermoelectric pellets and the second electrodes, the second die facing the second electrodes. A transfer unit is configured to transfer at least one of the first die and the second die to adjust a distance between the first die and the second die.

20 Claims, 11 Drawing Sheets

(51) Int. Cl.
*H01L 23/532* (2006.01)
*H01L 29/40* (2006.01)
*H01L 35/22* (2006.01)
*H01L 35/30* (2006.01)
*H01L 35/32* (2006.01)
*H01L 35/34* (2006.01)

(52) U.S. Cl.
CPC .............. *H01L 35/22* (2013.01); *H01L 35/30* (2013.01); *H01L 35/32* (2013.01); *H01L 35/34* (2013.01)

(56) References Cited

U.S. PATENT DOCUMENTS

| | | | |
|---|---|---|---|
| 6,911,606 B2 * | 6/2005 | Suda | H01L 21/563 174/259 |
| 2010/0024667 A1 | 2/2010 | Ikura | |
| 2014/0219854 A1 * | 8/2014 | Matsen | B22F 3/16 419/29 |
| 2019/0051808 A1 * | 2/2019 | Larsson | H01L 35/18 |

* cited by examiner

APPARATUS FOR MANUFACTURING A THERMOELECTRIC MODULE

CROSS-REFERENCE TO RELATED APPLICATIONS

This application is based on and claims priority to Korean Patent Application No. 10-2016-0141155, filed on Oct. 27, 2016, which application is hereby incorporated herein by reference.

TECHNICAL FIELD

The present disclosure relates to an apparatus of manufacturing a thermoelectric module.

BACKGROUND

In general, thermoelectric modules are used in thermoelectric power generation systems based on a Seebeck effect that electromotive force is generated using the difference in temperature between both surfaces of the thermoelectric modules.

When thermoelectric generation is performed by the thermoelectric module, as the difference in temperature between a heat absorption part and a heat radiation part is greatly maintained, the quantity of power generated through the thermoelectric generation may be increased. In this case, a heat transfer rate from a heat source to the thermoelectric module greatly influences the quantity of power generated from the thermoelectric generation.

In the thermoelectric module, a plurality of thermoelectric pellets having mutually different polarities (N type semiconductor and P type semiconductor) are alternately aligned with each other, and electrically connected with each other in series by electrodes, and an insulating substrate may be attached to each electrode.

The electrodes include a first electrode, which receives high-temperature heat, corresponding to the heat absorber of the thermoelectric module, and a second electrode, which receives low-temperature heat, corresponding to the heat radiation part of the thermoelectric module. The first and second electrodes are bonded to the thermoelectric pellets, respectively, by adhesives having conductivity. However, since the first and second electrodes require mutually different use temperatures, the first electrode is bonded to the thermoelectric pellet using a first adhesive having a higher melting point, and the second electrode is bonded to the thermoelectric pellet using a second adhesive having a lower melting point.

In a conventional thermoelectric module manufacturing apparatus to manufacture the thermoelectric module, first electrodes are bonded to the thermoelectric module using the first adhesive under a higher-temperature atmosphere, and then second electrodes are bonded to the thermoelectric module using the second adhesive under a lower-temperature atmosphere.

According to the conventional thermoelectric module, the surface of the thermoelectric pellet, to which the second electrode is bonded, is oxidized due to the higher-temperature atmosphere made when the first electrode is bonded to the thermoelectric pellet. As a result, according to the conventional thermoelectric module, the wettability for the bonding of the second electrode may be adversely influenced, and electric conductivity and thermal conductivity may be degraded, and the performance or the durability of the thermoelectric module may be degraded.

In addition, according to the conventional thermoelectric module manufacturing apparatus, two bonding processes are required for the electrodes. Accordingly, the productivity of the thermoelectric module may be lowered.

SUMMARY

The present disclosure has been made to solve the above-mentioned problems occurring in the prior art while advantages achieved by the prior art are maintained intact.

An aspect of the present disclosure provides an apparatus of manufacturing a thermoelectric module, which has an improved structure to prevent a thermoelectric pellet from being oxidized when a bonding process for electrodes is performed.

In addition, an aspect of the present disclosure provides an apparatus of manufacturing a thermoelectric module, which has an improved structure to bond thermoelectric pellets to electrodes through one bonding process.

The technical problems to be solved by the present disclosure are not limited to the aforementioned problems, and any other technical problems not mentioned herein will be clearly understood from the following description by those skilled in the art to which the present disclosure pertains.

According to an aspect of the present disclosure, an apparatus for manufacturing a thermoelectric module may include thermoelectric pellets, first electrodes that correspond to surfaces of the thermoelectric pellets, second electrodes that correspond to opposite surfaces of the thermoelectric pellets, and an insulating substrate that insulates the first electrodes from each other. The apparatus may include a fixing unit including a fixing tray to which the thermoelectric module is fixed and the first die including a first heating member that heats a first adhesive layer, which is interposed between the surfaces of the thermoelectric pellets and the first electrodes. The fixing tray is mounted on the first die such that the insulating substrate faces the first heating member. A second die includes a second heating member that heats a second adhesive layer, which is interposed between the opposite surfaces of the thermoelectric pellets and the second electrodes. The second die faces the second electrodes. A transfer unit transfers at least one of the first die and the second die to adjust a distance between the first die and the second die.

Preferably, the first die may include a mounting groove, in which the fixing tray is mounted, and a guide hole defined to communicate the first heating member with the mounting groove. The first heating member may be mounted corresponding to the insulating substrate exposed to an outside through the guide hole.

Preferably, the first heating member may be a laser head that heats the first adhesive layer by irradiating a laser beam toward the insulating substrate.

Preferably, the fixing tray may include an insertion hole bored to communicate the insulating substrate with the first heating member, and a transmissive window which is inserted into the insertion hole to support the insulating substrate, and includes a material for transmitting the laser beam.

Preferably, the transfer unit may include at least one cylinder body fixed to one of the first die and the second die, and at least one cylinder rod fixed to a remaining one of the first die and the second die and reciprocally transferred by the at least one cylinder body.

Preferably, the fixing unit may further include a guide member including a plurality of guide ribs extending while passing through a space between the thermoelectric pellets and are detachably mounted in the fixing tray.

Preferably, the guide member may include a first guide member including a plurality of first guide ribs extending while passing through the space between the thermoelectric pellets in one direction, and a second guide member including a plurality of second guide ribs extending while passing through the space between the thermoelectric pellets in another direction which forms a predetermined angle with the one direction.

Preferably, the fixing tray may further include a plurality of rib grooves into which the guide ribs are inserted, respectively.

Preferably, the guide member may be separated from the fixing tray when the first and second adhesive layers are heated.

Preferably, the second heating member may include a plurality of heaters provided to face one of the second electrodes and to heat the second adhesive layer, and each of the heaters may press and make contact with the one of the second electrodes by the transfer unit.

Preferably, the second heating member may further include a plurality of elastic members which elastically press one of the heaters toward the one of the second electrodes.

Preferably, the second heating member may further include a pressing block including a plurality of heater insertion grooves which are formed while being spaced apart from each other by a mounting distance between the thermoelectric pellets, each elastic member may be securely mounted in an inner lateral side of one of the heater insertion grooves, and each heater may be inserted into the one of the heater insertion grooves such that the heater is elastically supported by the elastic member.

Preferably, the first heating member may be provided to transfer heat corresponding to a melting point of the first adhesive layer to the first adhesive layer through the insulating substrate and the first electrode, and the second heating member may be provided to transfer heat corresponding to a melting point of the second adhesive layer to the second adhesive layer through the second electrode.

BRIEF DESCRIPTION OF THE DRAWINGS

The above and other objects, features and advantages of the present disclosure will be more apparent from the following detailed description taken in conjunction with the accompanying drawings.

DETAILED DESCRIPTION OF ILLUSTRATIVE EMBODIMENTS

Figure 1:
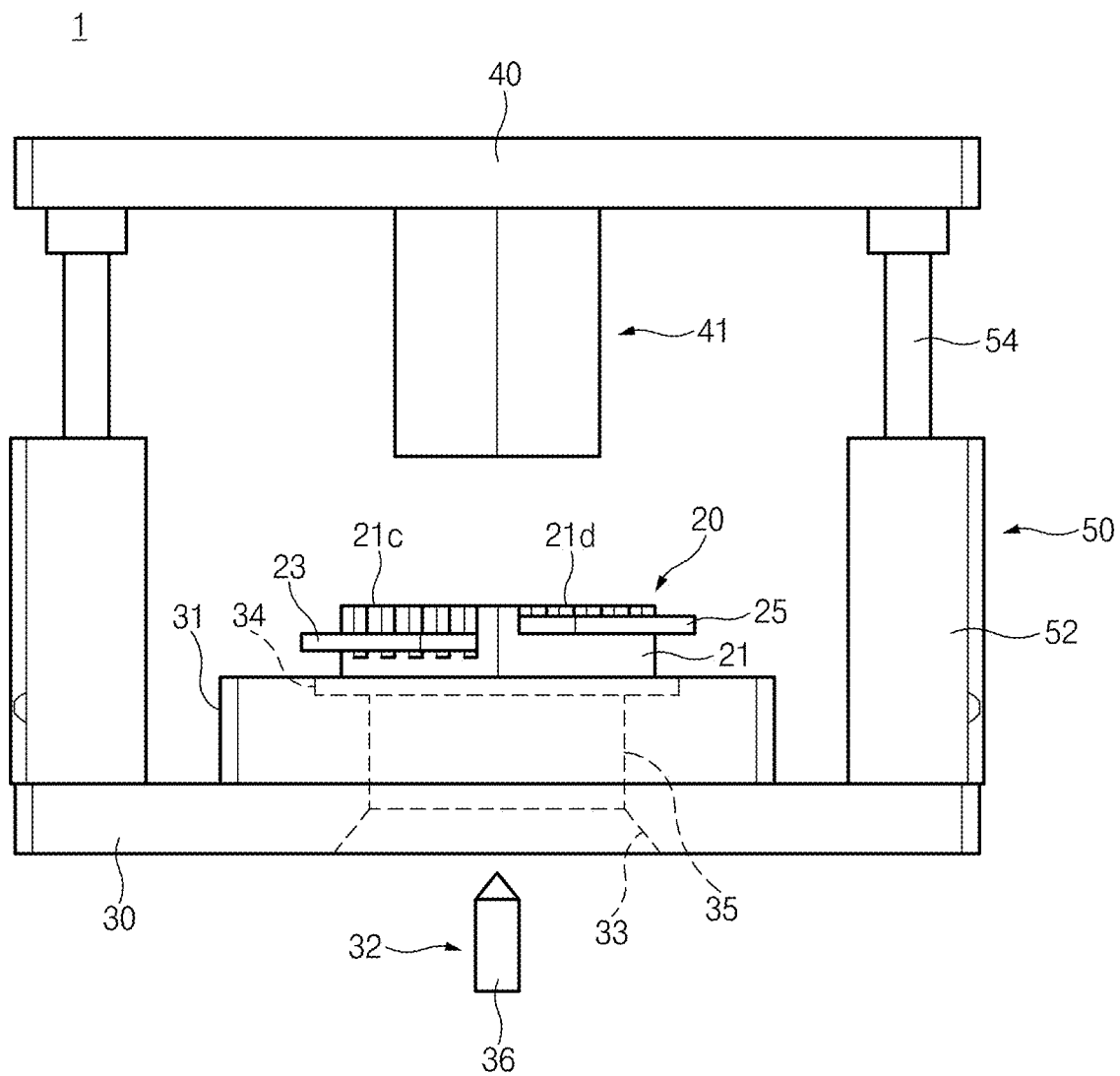
FIG. 1 is a front view illustrating an apparatus of manufacturing a thermoelectric module, according to an exemplary embodiment of the present disclosure.

Terms and words used in the specification and the claims shall not be interpreted as commonly-used dictionary meanings, but shall be interpreted as to be relevant to the technical scope of the invention based on the fact that the inventor may properly define the concept of the terms to explain the invention in best ways. Accordingly, the embodiments and the configurations depicted in the drawings are illustrative purposes only and do not represent all technical scopes of the embodiments, so it should be understood that various equivalents and modifications may exist at the time point of filing this application.

The size of each of elements and the size of a specific part of the element, which are shown in accompanying drawings, may be exaggerated, omitted or schematically drawn for the purpose of convenience or clarity. In addition, the size of elements does not utterly reflect an actual size. In the following description, detailed descriptions of functions or configurations of well-known elements will be ruled out in order not to unnecessarily obscure the gist of the present disclosure.

FIG. 1 is a front view illustrating an apparatus 1 for manufacturing a thermoelectric module according to an exemplary embodiment of the present disclosure.

Referring to FIG. 1, the apparatus 1 for manufacturing the thermoelectric module according to an exemplary embodiment of the present disclosure (hereinafter referred to as "thermoelectric module manufacturing apparatus") includes a fixing unit 20, which fixes a thermoelectric module 10 thereto, a first die 30, on which thermoelectric pellets 11 and 12 may be bonded to a first electrode 13, a second die 40, on which thermoelectric pellets 11 and 12 may be bonded to a second electrode 14, and a transfer unit 50 which adjusts the distance between the first die 30 and the second die 40.

Figure 2:
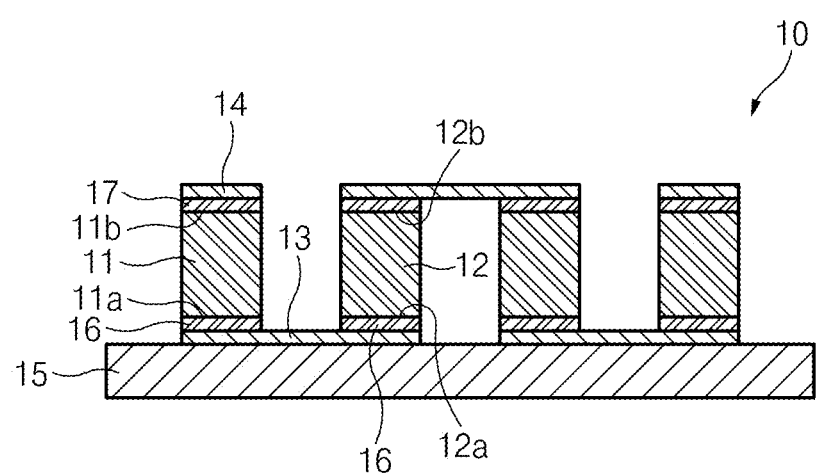
FIG. 2 is a front view illustrating the thermoelectric module.

FIG. 2 is a front view illustrating the thermoelectric module.

As illustrated in FIG. 2, the thermoelectric module 10 may include a plurality of thermoelectric pellets 11, a plurality of thermoelectric pellets 12, first electrodes 13 which correspond to one surfaces of the thermoelectric pellets 11 and 12, second electrodes 14 which correspond to opposite surfaces of the thermoelectric pellets 11 and 12, a first adhesive layer 16 interposed between the thermoelectric pellets 11 and 12 and the first electrodes 13, a second adhesive layer 17 interposed between the thermoelectric pellets 11 and 12 and the second electrodes 14, and an insulating substrate 15 which insulates the first electrodes 13 from each other.

Figure 11:
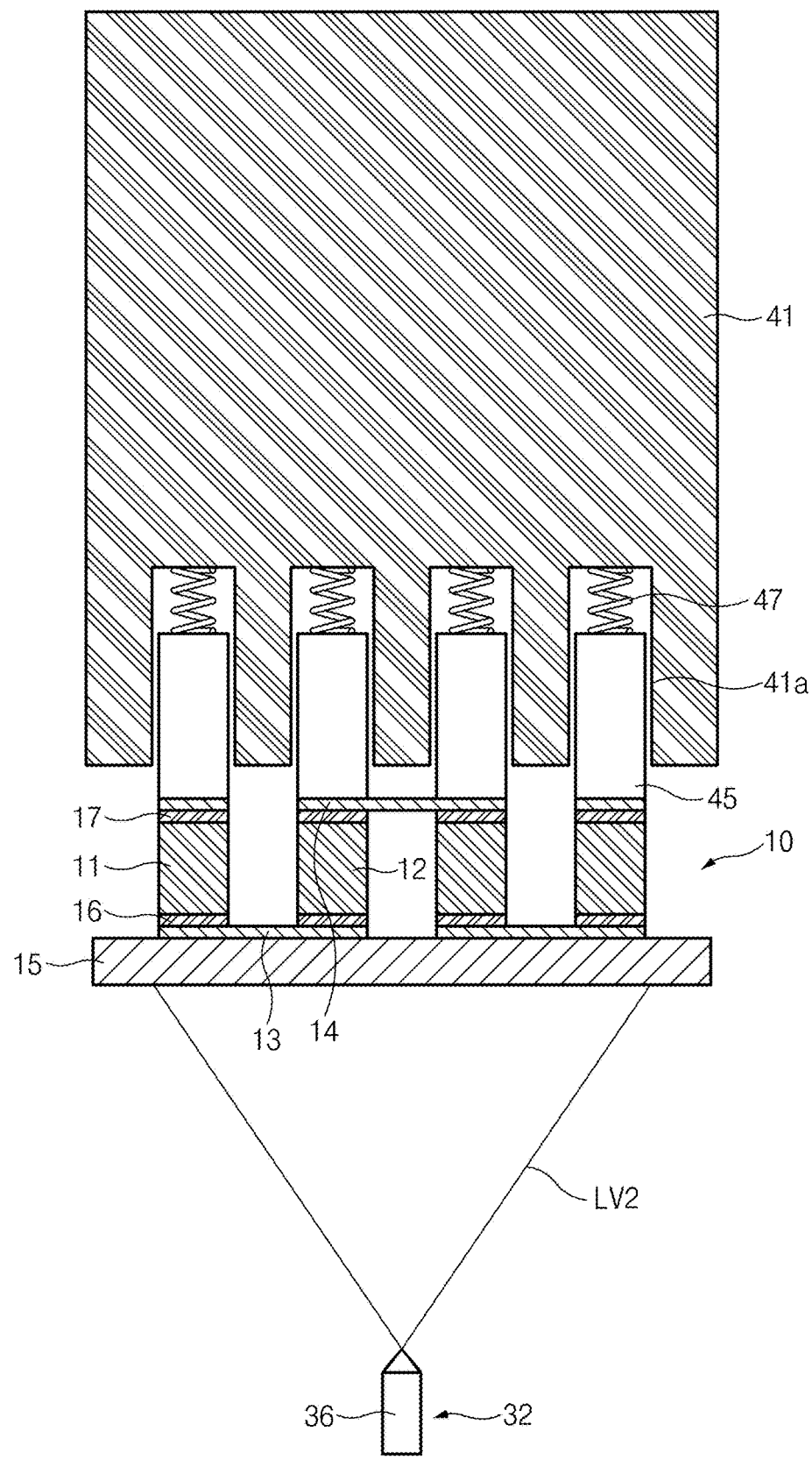
FIG. 11 is a view illustrating another method of bonding thermoelectric pellets to an electrode using the heating members illustrated in FIG. 4.

As illustrated in FIG. 2, the thermoelectric pellets 11 and 12 include a first thermoelectric pellet 11 and a second thermoelectric pellet 12 having mutually opposite polarities. For example, when the first thermoelectric pellet 11 is an N type semiconductor, the second thermoelectric pellet 12 is a P type semiconductor. When the first thermoelectric pellet 11 is a P type semiconductor, the second thermoelectric pellet 12 is an N type semiconductor. First thermoelectric pellets 11 are alternately aligned with second thermoelectric pellets 12 as illustrated in FIG. 11.

As illustrated in FIG. 2, the first and second thermoelectric pellets 11 and 12 have first bonding surfaces 11a and 12a, which are one surfaces corresponding to any one of a heat absorption part and a heat radiation part of the thermoelectric module 10, and second bonding surfaces 11b and 12b which are opposite surfaces corresponding to a remaining one of the heat absorption part and the heat radiation part of the thermoelectric module 10. Hereinafter, the present disclosure will be described in that the first bonding surfaces 11a and 12a correspond to the heat absorption part of the thermoelectric module 10, and the second bonding surfaces 11b and 12b correspond to the heat radiation part of the thermoelectric module 10.

Each of the first electrodes 13 is provided to electrically connect the first bonding surfaces 11a and 12a of one pair of the first and second thermoelectric pellets 11 and 12, which are adjacent to each other, with each other. To this end, as illustrated in FIG. 2, each first electrode 13 is provided to make contact with both first bonding surfaces 11a and 12a of the pair of first and thermoelectric pellets 11 and 12 adjacent to each other.

Figure 9:
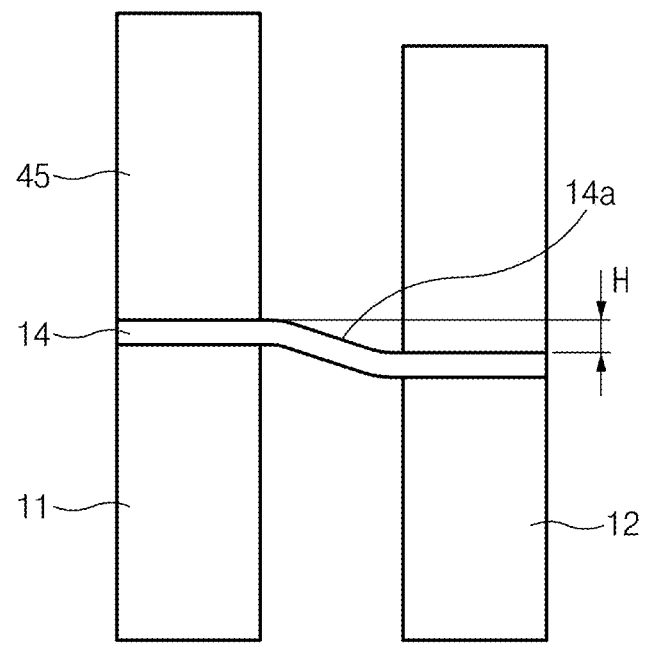
FIG. 9 is a view illustrating that the electrode compensates for the step difference between the thermoelectric pellets of FIG. 2.

Each of the second electrodes 14 is provided to electrically connect the second bonding surfaces 11b and 12b of one pair of first and thermoelectric pellets 11 and 12, which are adjacent to each other, to each other. To this end, as illustrated in FIG. 2, each of the second electrodes 14 is provided to make contact with both second bonding surfaces 11b and 12b of the pair of first and thermoelectric pellets 11 and 12 are adjacent to each other. The second electrode 14 is provided such that a connection part 14a of the second electrode 14 is interposed between the first and second thermoelectric pellets 11 and 12 and bent when the second electrode 14 is pressed by a heater 45 to be described later as illustrated in FIG. 9. For example, the first electrodes 14 may have the form of a foil or may have the thickness of 1 mm or less.

As illustrated in FIG. 2, the first adhesive layer 16 is interposed between the first bonding surfaces 11a and 12a of the first and second thermoelectric pellet 11 and 12 and one surface of the first electrode 13. For example, the first adhesive layer 16 may be formed by coating the first bonding surfaces 11a and 12a of the first and second thermoelectric pellet 11 and 12 or the one surface of the first electrode 13 with a first adhesive. The first adhesive preferably includes a material having a higher melting point because a higher temperature is actually applied to the heat absorption part of the thermoelectric module 10. For example, the first adhesive may be a silver (Ag)-based brazing filler.

As illustrate in FIG. 2, the second adhesive layer 17 is interposed between the second bonding surfaces 11b and 12b of the first and second thermoelectric pellets 11 and 12 and one surface of the second electrode 14. For example, the second adhesive layer 17 may be formed by coating the second bonding surfaces 11b and 12b of the first and second thermoelectric pellet 11 and 12, or the one surface of the second electrode 14 with a second adhesive. The second adhesive preferably includes a material having a lower melting point because a lower temperature is actually applied to the heat radiation part of the thermoelectric module 10. For example, the second adhesive may be a silver (Ag)-based thermal paste.

As illustrated in FIG. 2, the insulating substrate 15 is provided to make contact with an opposite surface of the first electrode 13. The insulating substrate 15 is formed of an insulating material for insulating the first electrode 13 from the outside. For example, the insulating substrate 15 may be formed of alumina or other ceramic materials having an insulating property.

Meanwhile, although the second electrode 14 may be preferably subject to insulation treatment such that the second electrode 14 may be insulated from the outside, the present disclosure is not limited thereto. For example, when the thermoelectric module 10 is actually used, an insulating material having high thermal conductivity is applied to the second electrode 14 to prevent the second electrode 14 from being shorted. The insulating material having the high thermal conductivity may be a silicon-based thermally conductive paste or a silicon-based thermally conductive sheet. In particular, the silicon-based thermally conductive paste may be a material containing ceramic-based fillers, such as alumina and boron nitride, having an electrically insulating property and high thermal conductivity.

Figure 3:
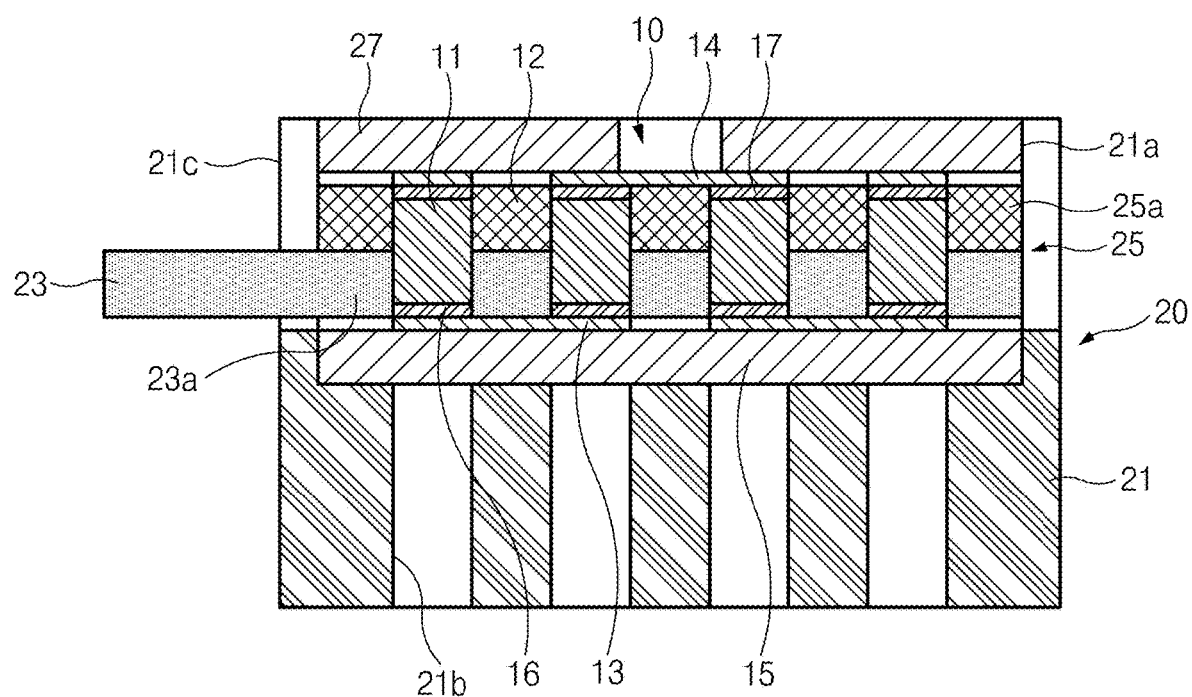
FIG. 3 is a sectional view illustrating one example of a fixing unit of FIG. 1.
Figure 4:
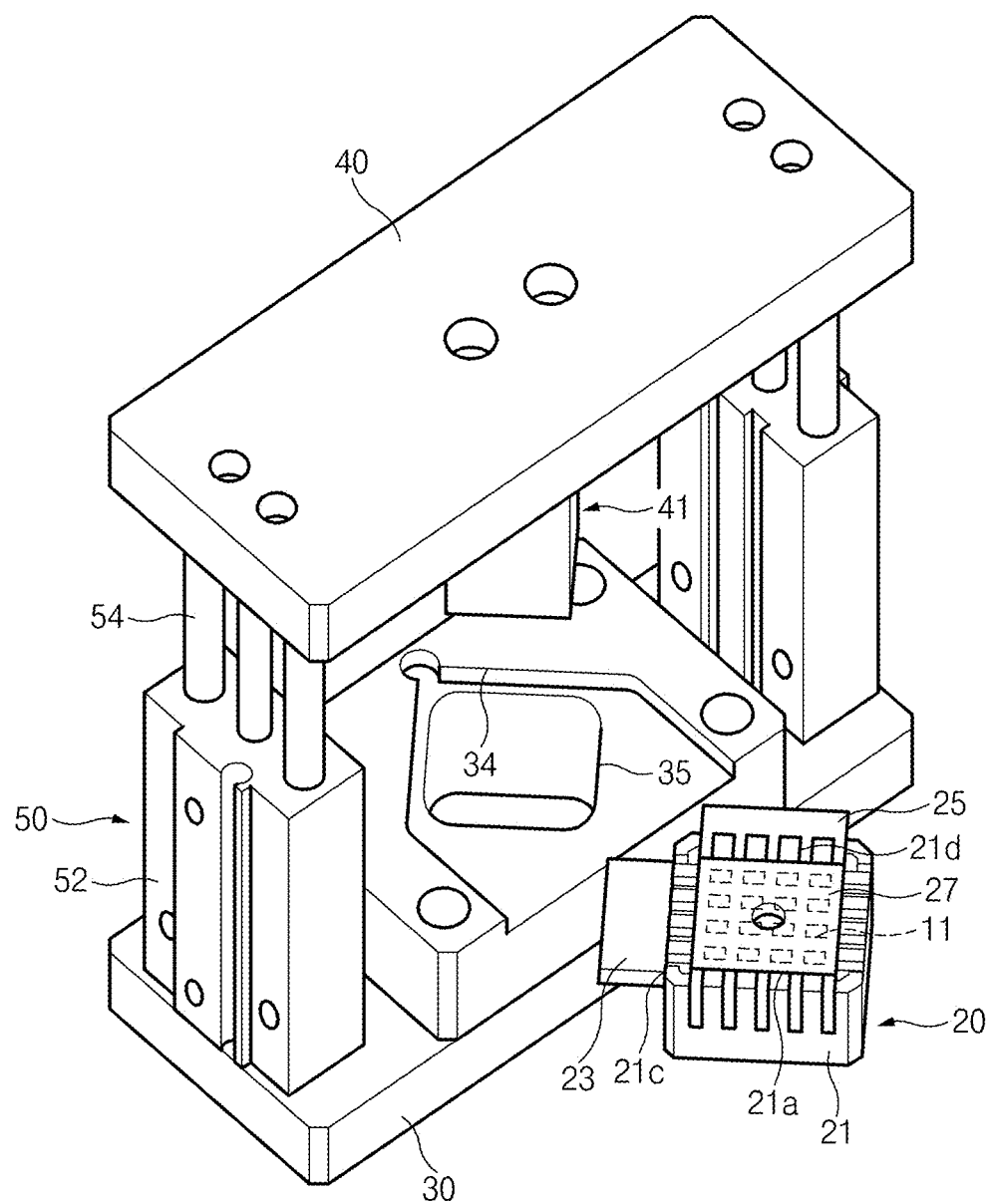
FIG. 4 is an exploded perspective view illustrating the apparatus of manufacturing the thermoelectric module of FIG. 1.
Figure 5:
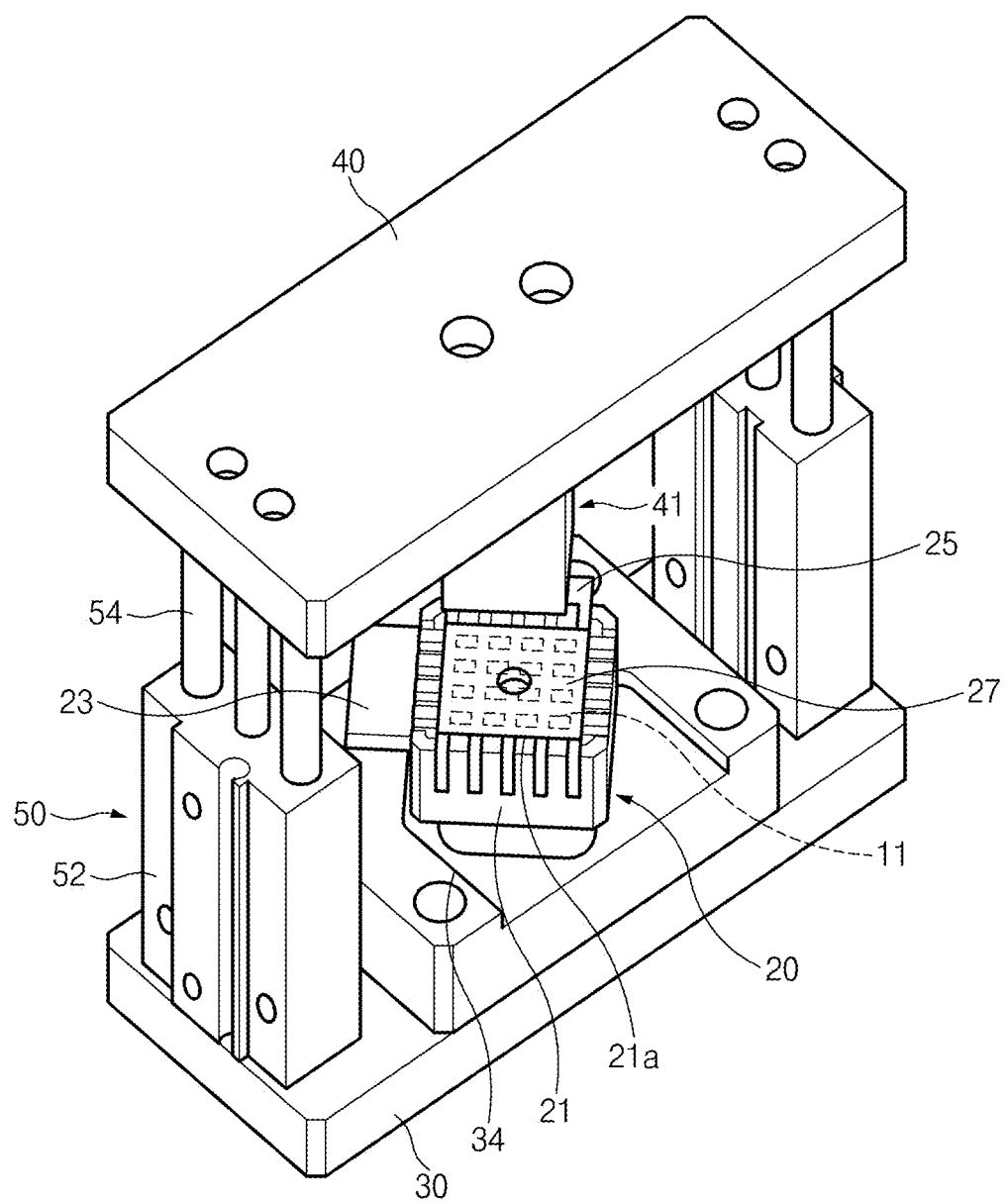
FIG. 5 is an assembled perspective view illustrating the apparatus of manufacturing the thermoelectric module of FIG. 1.

FIG. 3 is a sectional view illustrating one example of the fixing unit 20 illustrated in FIG. 1. FIG. 4 is an exploded perspective view illustrating the thermoelectric module manufacturing apparatus 1 illustrated in FIG. 1. FIG. 5 is an assembled perspective view illustrating the thermoelectric module manufacturing apparatus 1 illustrated in FIG. 1.

The fixing unit 20 is provided to mount the thermoelectric module 10 on the first die 30. For example, as illustrated in FIG. 3, the fixing unit 20 may include a fixing tray 21, to which the thermoelectric module 10 is fixed, guide members 23 and 25 which align the thermoelectric pellets 11 and 12 in a preset arrangement form, and a fixing cover 27 which covers the thermoelectric module 10 and the guide members 23 and 25.

As illustrated in FIGS. 3 and 4, the fixing tray 21 may include a fixing groove 21a, a plurality of communication holes 21b, a plurality of first rib insertion grooves 21c, a plurality of second rib insertion grooves 21d.

As illustrated in FIG. 3, the fixing groove 21a is formed by opening a top surface of the fixing tray 21 corresponding to the thermoelectric module 10. The thermoelectric module 10 is inserted into the fixing groove 21a and fixed into the fixing groove 21a such that the insulating substrate 15 is securely mounted by inner lateral sides of the fixing groove 21a. In other words, the thermoelectric module 10 is fixed into the fixing groove 21a such that the second electrode 14 is directed toward an opening of the fixing groove 21a.

As illustrated in FIG. 3, each communication hole 21b communicates with the fixing groove 21a and is bored through a bottom surface of the fixing tray 21 corresponding to any one of the thermoelectric pellets 11 and 12. The communication holes 21b allow the fixing groove 21a to communicate with guide holes 33 and 35 formed in the first die 30, which will be described later. The thermoelectric module 10 may be irradiated with a laser beam (LV) which is radiated from a first heating member 32 to be described later and sequentially passes through the guide holes 33 and 35 and the communication hole 21b.

As illustrated in FIG. 4, the first rib insertion grooves 21c are formed in one sidewall of the fixing tray 21 while extending in one direction and are spaced apart from each other by a distance between the thermoelectric pellets 11 and 12. First guide ribs 23a of a first guide member 23 to be described later may be inserted into the first rib insertion grooves 21c, respectively.

As illustrated in FIG. 4, the second rib insertion grooves 21d are formed in another sidewall of the fixing tray 21, which is performed perpendicularly to the one sidewall of the fixing tray 21, and are spaced apart from each other by a distance between the thermoelectric pellets 11 and 12. Second guide ribs 25a of a second guide member 25 to be described later may be inserted into the second rib insertion grooves 21d, respectively.

As illustrated in FIG. 4, the guide members 23 and 25 may include the first guide member 23 and the second guide member 25.

Figure 7:
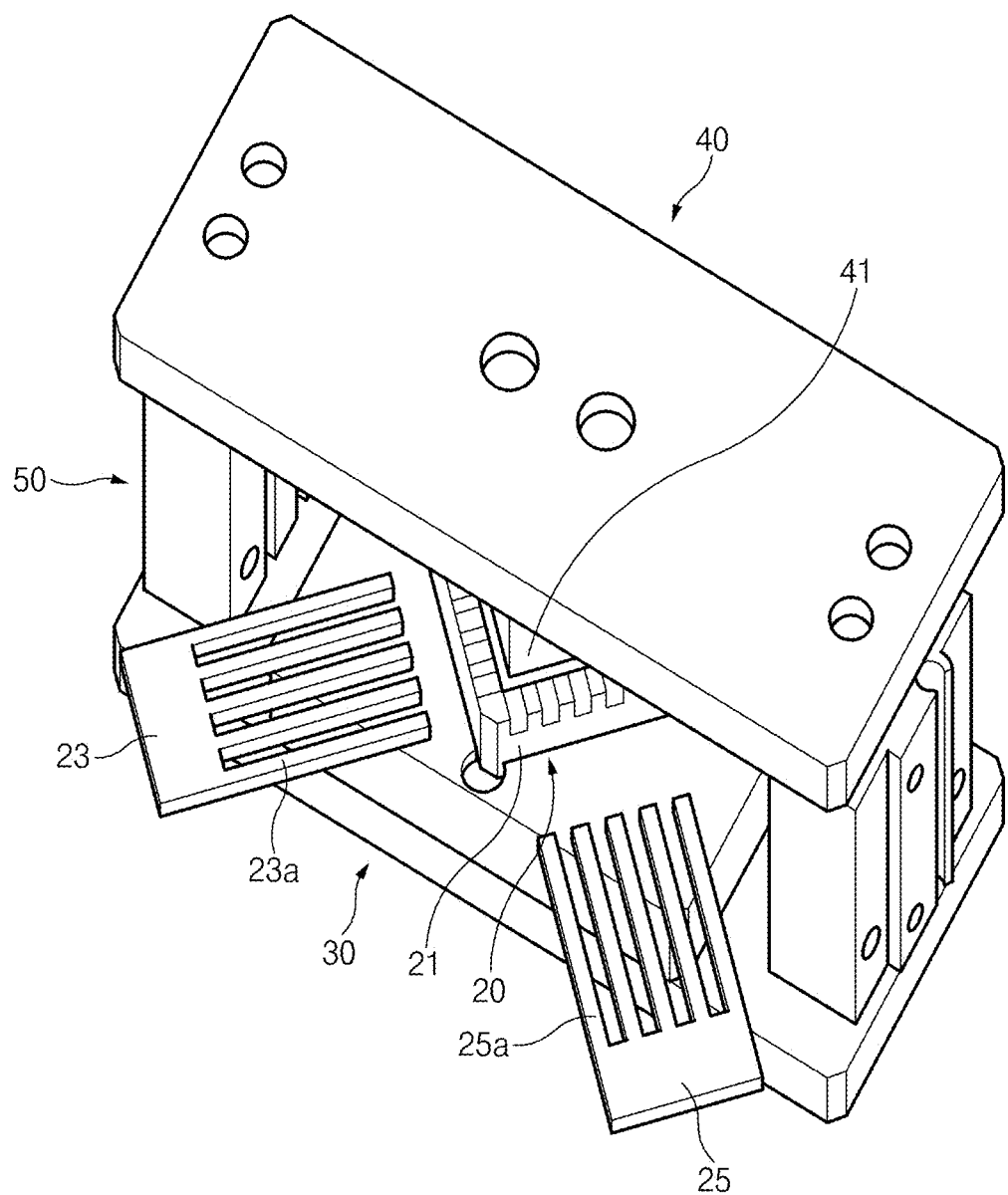
FIG. 7 is an assembled perspective view illustrating the thermoelectric module pressed by a second die in the apparatus of manufacturing the thermoelectric module of FIG. 1.

As illustrated in FIG. 7, the first guide member 23 may have the first guide ribs 23a, each of which extends through the space between one pair of thermoelectric pellets 11 and 12, which are adjacent to each other, in one direction. As illustrated in FIGS. 3 and 4, the first guide member 23 may be detachably mounted in the fixing tray 21 such that each first guide rib 23a is inserted into any one of the first insertion grooves 21c of the fixing tray 21 while extending through the space between the thermoelectric pellets 11 and 12, which are adjacent to each other, in the direction. Although it is preferred that the first guide member 23 is provided such that each first guide rib 23a is securely mounted on the first electrode 13 or the insulating substrate 15 as illustrated in FIG. 3, the present disclosure is not limited thereto.

As illustrated in FIG. 7, the second guide member 25 may have the second guide ribs 25a, each of which extends through the space between one pair of thermoelectric pellets 11 and 12, which are adjacent to each other, in a direction perpendicular to the one direction. As illustrated in FIGS. 3 and 4, the second guide member 25 may be detachably mounted in the fixing tray 21 such that each second guide rib 25a is inserted into one second insertion groove 21d of the fixing tray 21 while extending through the space between the thermoelectric pellets 11 and 12, which are adjacent to each other, in another direction. Although it is preferred that the second guide ribs 25a of the second guide member 25 are securely mounted on the first guide ribs 23a, respectively, as illustrated in FIG. 3, the present disclosure is not limited thereto.

The first and second guide members 23 and 25 support the first and second thermoelectric pellets 11 and 12 by the guide ribs 23a and 25a in one direction and another direction, respectively. Accordingly, the first and second guide members 23 and 25 may align the thermoelectric pellets 11 and 12 in a preset arrangement form.

As illustrated in FIG. 3, the fixing cover 27 is formed in a shape corresponding to the shape of the fixing groove 21a. The fixing cover 27 is detachably inserted into the fixing groove 21a to cover the guide ribs 23a and 25a and the thermoelectric module 10.

Figure 6:
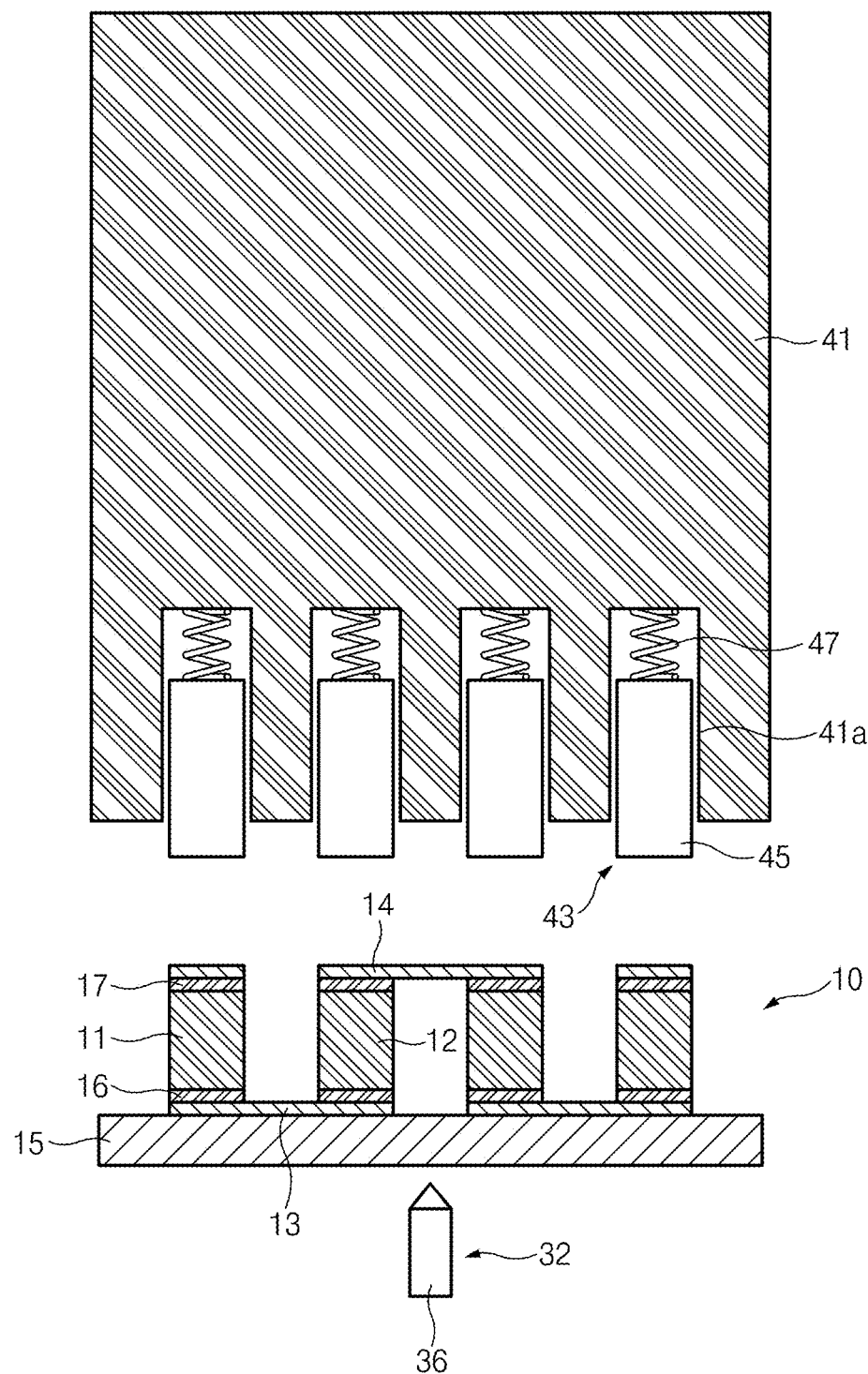
FIG. 6 is a front view illustrating the location relationship between the heating members and the thermoelectric module of FIG. 1.

FIG. 6 is a front view to explain the location relationship between heating members and the thermoelectric module 10 of FIG. 1.

The first die 30 is provided such that the first bonding surfaces 11a and 12a of the thermoelectric pellets 11 and 12 may be bonded to the first electrode 13 through the first adhesive layer 16. To this end, the first die 30 may include a first guide hole 33, a support block 31, and a first heating member 32.

As illustrated in FIG. 1, the first guide hole 33 is formed through the first die 30 such that the first guide hole 33 corresponds to the communication holes 21b formed in the fixing tray 21. Although the first guide hole 33 preferably has a taper shape in which the diameter of the first guide hole 33 is gradually reduced toward the fixing tray 21, the present disclosure is not limited thereto.

As illustrated in FIG. 1, the support block 31 is mounted on one surface of the first die 30. The support block 31 may include a mounting groove 34 and a second guide hole 35.

As illustrated in FIG. 4, the mounting groove 34 is formed in one surface of the support block 31 such that the mounting groove 34 faces a pressing block 41 to be described later. Preferably, the mounting groove 34 has a shape corresponding to the shape of the fixing tray 21 to support the fixing tray 21. As illustrated in FIG. 5, the fixing tray 21 is mounted in the mounting groove 34 such that the second electrodes 14 are directed toward the pressing block 41.

As illustrated in FIG. 1, the second guide hole 35 is formed through the support block 31 corresponding to the communication holes 21b of the fixing tray 21 such that the second guide hole 35 communicates with each of the mounting groove 34 and the first guide hole 33.

Figure 8:
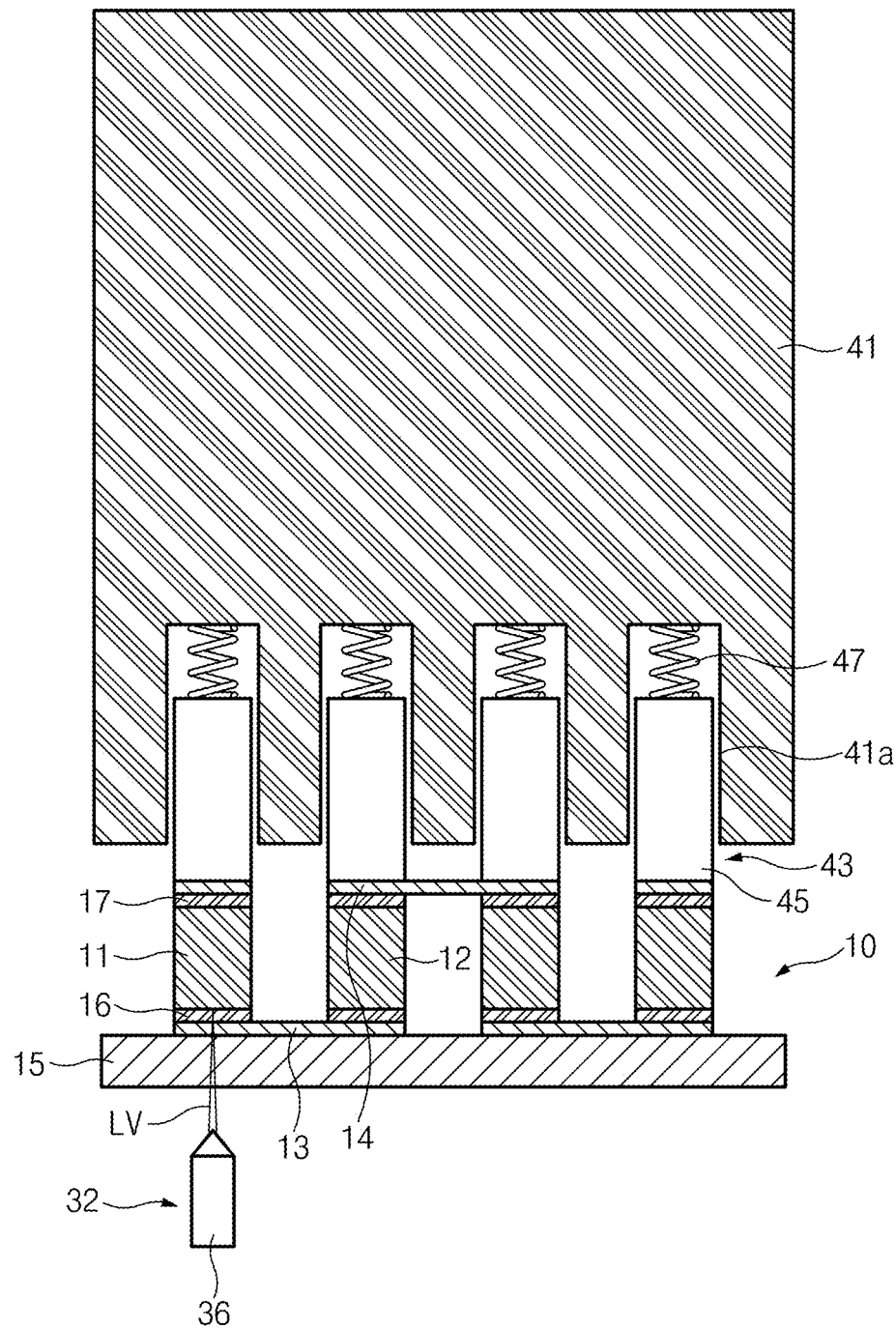
FIG. 8 is a view illustrating a method of bonding thermoelectric pellets to an electrode using heating members illustrated in FIG. 4.

As illustrated in FIG. 6, the first heating member 32 is provided to face the insulating substrate 15. For example, the first heating member 32 may be provided inside or outside the guide hole 33 or 35 such that the first heating member 32 corresponds to the communication holes 21b. Preferably, the first heating member 32 is provided to transfer heat corresponding to the melting point of the first adhesive layer 16 to the first adhesive layer 16 through the insulating substrate 15 and the first electrode 13. In other words, when the first adhesive is the Ag-based brazing filler, the first heating member 32 is provided to raise the temperature of the first adhesive layer 16 to 450° C. or more. For example, the first heating member 32 may be a laser head 36 which may emit a laser beam LV. The laser head 36 may be a laser nozzle or a laser scanner. The laser head 36 may irradiate the laser beam LV onto the insulating substrate 15 corresponding to the thermoelectric pellets 11 and 12 as illustrated in FIG. 8.

The second die 40 is provided such that the second bonding surfaces 11b and 12b of the thermoelectric pellets 11 and 12 may be bonded to the second electrode 14 through the second adhesive layer 17. To this end, the second die 40 may include the pressing block 41, a second heating member 43, and an elastic member 47.

As illustrated in FIG. 5, the pressing block 41 is mounted on one surface of the second die 40 to face the thermoelectric module 10 fixed to the fixing tray 21. As illustrated in FIG. 6, the pressing block 41 includes a plurality of heater insertion grooves 41a recessed corresponding the thermoelectric pellets 11 and 12.

Preferably, the second heating member 43 is provided to transfer heat corresponding to the melting point of the second adhesive layer 17 to the second adhesive layer 17 through the second electrode 14. In other words, when the second adhesive is the Ag-based thermal paste, the second heating member 42 is provided to raise the temperature of the second adhesive layer 17 to less than 200° C. For example, the second heating member 43 may include a plurality of heaters 45 as illustrated in FIG. 6. The heaters 45 may be formed in the shape of a stick having a sectional area corresponding to those of the thermoelectric pellets 11 and 12. Each heater 45 may be formed of a metallic material having higher thermal conductivity, and a heating line (not shown), which emits heat by power supplied thereto from the outside, may be buried in the heater 45. As illustrated in FIG. 6, each heater 45 may be inserted into and mounted in any one of the heater insertion grooves 41a such that the heater 45 is supported by the elastic member 47.

As illustrated in FIG. 6, the elastic member 47 may be securely mounted on an inner surface of the heater insertion groove 41a such that the elastic member 47 is interposed between the inner surface of the heater insertion groove 41a and the heater 45. The elastic member 47 is provided to elastically press the heater 45, which is inserted into the heater insertion groove 41a, toward the thermoelectric pellets 11 and 12. For example, the elastic member 47 may be a compressive spring as illustrated in FIG. 8.

The transfer unit 50 is provided to adjust the distance between the first die 30 and the second die 40. The transfer unit 50 preferably includes at least one cylinder. For example, as illustrated in FIG. 1, the transfer unit 50 may include a cylinder body 52 fixed to the first die 30 and a cylinder rod 54 fixed to the second die 40 and reciprocally transferred by the cylinder body 52. The transfer unit 50 may reciprocally transfer the second die 40 such that the second die 40 approaches the first die 30 or is away from the first die 30.

FIG. 7 is an assembled perspective view illustrating the thermoelectric module 10 pressed by the second die 40 in the thermoelectric module manufacturing apparatus 1 of FIG. 1. FIG. 8 is a view illustrating a method of bonding the thermoelectric pellets 11 and 12 to the electrode using the heating member of FIG. 4. FIG. 9 is a view illustrating that the electrode 13 compensates for the step difference between the thermoelectric pellets 11 and 12 of FIG. 2.

Hereinafter, a method of manufacturing the thermoelectric module 10 using the thermoelectric module manufacturing apparatus 1 will be described with reference to accompanying drawings.

First, as illustrated in FIG. 3, after the thermoelectric module 10 is fixed into the fixing groove 21a of the fixing tray 21, the thermoelectric pellets 11 and 12 are aligned using the first and second guide members 23 and 25 and the fixing cover 27. In the operation in which the above thermoelectric module 10 is fixed into the fixing groove 21a, the first and second adhesive layers 16 and 17 are only interposed between the first and second bonding surfaces 11a and 12a and 11b and 12b of the first and second thermoelectric pellets 11 and 12 and the first and second electrodes 13 and 14. In this state, the first and second bonding surfaces 11a and 12a, and 11b and 12b of the first and second thermoelectric pellets 11 and 12 are not bonded to the first and second electrodes 13 and 14.

As illustrated in FIG. 5, the fixing tray 21 having the thermoelectric module 10 fixed thereto is mounted in a preset position of the mounting groove 34.

Thereafter, as illustrated in FIG. 7, the first and second guide members 23 and 25 and the fixing cover 27 are separated from the fixing tray 21.

Next, as illustrated in FIGS. 7 and 8, the second die 40 is transferred to the first die 30 by the transfer unit 50 such that the second electrodes 14 are pressed by the heaters 45.

Subsequently, as illustrated in FIG. 8, the laser head 36 is actuated to irradiate the laser beam LV to the insulating substrate 15, and the heaters 45 are actuated to apply heat to the second electrodes 14.

Then, as illustrated in FIG. 8, the laser beam LV is irradiated to the first adhesive layer 16 after being transmitted through the insulating substrate 15 and the first electrode 13. Accordingly, the first adhesive layer 16 is heated to the melting point by the laser beam LV and melted. Thus, the first bonding surfaces 11a and 12a of the thermoelectric pellets 11 and 12 are bonded to the first electrode 13 by the melted first adhesive layer 16.

As illustrated in FIG. 8, each of the heaters 45 heats the second adhesive layer 17 through the second electrode 14. Accordingly, the second adhesive layer 17 is heated to the melting point thereof by the heater 45 and melted. Thus, the second bonding surfaces 11b and 12b of the thermoelectric pellets 11 and 12 are bonded to the second electrode 14 by the melted second adhesive layer 17.

The heaters 45 may elastically press the thermoelectric pellets 11 and 12, the first and second electrodes 13 and 14, and the first and second the adhesive layers 16 and 17 toward the insulating substrate 15 by driving force transferred from the transfer unit 50 and elastic force transferred from the elastic members 47. Accordingly, bonding force may be improved at the interface between the bonding surfaces 11a, 11b, 12a, and 12b of the thermoelectric pellets 11 and 12, and the electrodes 13 and 14.

Meanwhile, as described above, the second electrodes 14 have preset shapes or preset thicknesses such that the connection parts 14a may be bent by the force applied thereto from the heaters 45. Accordingly, as illustrated in FIG. 9, when the step difference is made between the thermoelectric pellets 11 and 12 due to the process tolerance, the connection parts 14a of the second electrodes 14 are bent by the height H of the step difference. Accordingly, bonding force at the interfaces between the bonding surfaces 11a, 11b, 12a, and 12b of the thermoelectric pellets 11 and 12 and the electrodes 13 and 14 may be prevented from being degraded due to the step difference between the thermoelectric pellets 11 and 12.

Next, after the second die 40 is transferred using the transfer unit 50 such that the heaters 45 are spaced apart from the second electrodes 14, the thermoelectric module 10 having the thermoelectric pellets 11 and 12 and the electrodes 13 and 14, which are completely bonded to each other, may be separated from the fixing tray 21.

As described above, according to the thermoelectric module manufacturing apparatus 1, the first adhesive layer 16 having a higher melting point is heated by using the laser beam LV which may locally apply heat. Simultaneously, the second adhesive layer 17 having a lower melting point is heated by using the heaters 45 which may elastically press the thermoelectric pellets 11 and 12 and the electrodes 13 and 14. Accordingly, the thermoelectric module manufacturing apparatus 1 prevents the second bonding surfaces 11b and 12b of the thermoelectric pellets 11 and 12 corresponding to the heat radiation part of the thermoelectric module 10 from being oxidized due to the high-temperature heat radiated when the first adhesive layer 16 is heated, thereby stably ensuring the wettability for the bonding of the second electrodes 14 and improving the performance and the durability of the thermoelectric module 10.

In addition, according to the thermoelectric module manufacturing apparatus 1, predetermined pressure is applied between the thermoelectric pellets 11 and 12 and the electrodes 13 and 14 when the thermoelectric pellets 11 and 12 are bonded to the electrodes 13 and 14. Accordingly, the bonding force at the interface between the thermoelectric pellets 11 and 12 and the electrodes 13 and 14 may be improved.

In addition, according to the thermoelectric module manufacturing apparatus 1, in the state that the thermoelectric module 10 is fixed to a preset position of the fixing tray 21, the thermoelectric pellets 11 and 12 may be bonded to the electrodes 13 and 14. Accordingly, the performance and the durability of the thermoelectric module 10 may be more improved.

In addition, according to the thermoelectric module manufacturing apparatus 1, the thermoelectric pellets 11 and 12 are bonded to the first electrode 13 corresponding to the heat absorption part of the thermoelectric module 10 while being bonded to the second electrode 14 corresponding to the heat radiation part of the thermoelectric module 10. Accordingly, the productivity of the thermoelectric module 10 may be improved as compared with that of the related art in which the bonding processes are separately performed.

Meanwhile, although the thermoelectric pellets 11 and 12 are bonded to the first electrodes 13 using the laser beam LV, and the thermoelectric pellets 11 and 12 are bonded to the second electrodes 14 using the heaters 45 in the thermoelectric module manufacturing apparatus 1, the present disclosure is not limited thereto. In other words, the first heating member 32 is provided to include a pressing block, a heater, or an elastic member similarly to the second heating member 43, and the thermoelectric pellets 11 and 12 may be bonded to the first electrodes 13 using heaters.

Figure 10:
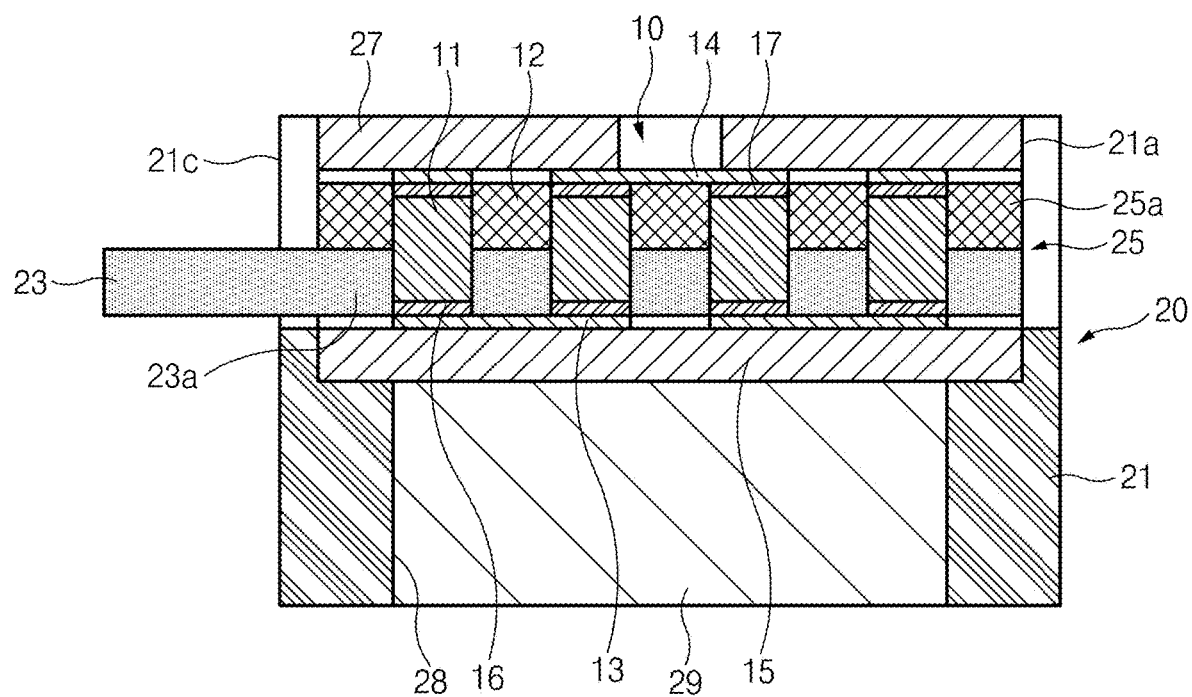
FIG. 10 is a sectional view illustrating the fixing unit of FIG. 1, according to another embodiment of the present disclosure.

FIG. 10 is a sectional view illustrating the fixing unit of FIG. 1, according to another embodiment.

Although the fixing unit 20 includes a plurality of communication holes 21b communicating with the guide holes 33 and 35 such that the insulating substrate 15 is irradiated with the laser beam LV emitted from the laser head 36, the present disclosure is not limited thereto. For example, as illustrated in FIG. 10, the fixing unit 20 may include an insertion hole 28 bored corresponding to the thermoelectric pellets 11 and 12 instead of the communication holes 21b and a transmissive window 29 inserted into the insertion hole 28 such that the transmissive window 29 may support the thermoelectric module 10 fixed into the fixing groove 21a.

As illustrated in FIG. 10, although the insertion hole 28 is formed through the bottom surface of the fixing tray 21 such that the insertion hole 28 faces the whole thermoelectric pellets 11 and 12 with the insulating substrate 15 interposed therebetween, the present disclosure is not limited thereto.

As illustrated in FIG. 10, the transmissive window 29 has the shape corresponding to that of the insertion hole 28 such that the transmissive window 29 is fitted into the insertion hole 28. For example, the transmissive window 29 may be formed of a glass material allowing the laser beam to pass therethrough.

FIG. 11 is a view illustrating another method of bonding thermoelectric pellets and electrodes using the heating members illustrated in FIG. 4.

Although the above description has been made in that the laser head 36 irradiates the laser beam to the first adhesive layer 16 through each communication hole 21b, the present disclosure is not limited thereto.

For example, as illustrated in FIG. 10, the laser head 36 may be provided to irradiate a laser beam LV2 having a beam spot with a diameter corresponding to the insulating substrate 15 to the insulating substrate 15 through the transmissive window 29. Then, the insulating substrate 15 is heated by the laser beam LV2, and the first adhesive layers are heated by receiving the heat from the insulating substrate 15 through the first electrodes. Accordingly, the thermoelectric pellets 11 and 12 are simultaneously bonded to the first electrodes 13 by the first adhesive layers 16, thereby reducing time taken to bond the thermoelectric pellets 11 and 12 to the first electrodes 13.

As described above, according to the present disclosure, the thermoelectric module manufacturing apparatus may simultaneously perform a process of bonding the heat absorption part of the thermoelectric module to a relevant electrode and a process of bonding the heat radiation part of the thermoelectric module to a relevant electrode. Therefore, according to the present disclosure, the bonding surface of the thermoelectric pellet may be prevented from being oxidized, and the wettability for the bonding of the electrodes may be stably ensured. According to the present disclosure, the performance and the durability of the thermoelectric module may be improved, and the productivity of the thermoelectric module may be improved.

Hereinabove, although the present disclosure has been described with reference to exemplary embodiments and the accompanying drawings, the present disclosure is not limited thereto, but may be variously modified and altered by those skilled in the art to which the present disclosure pertains without departing from the spirit and scope of the present disclosure claimed in the following claims.

What is claimed is:

1. An apparatus for manufacturing a thermoelectric module which comprises thermoelectric pellets, first electrodes corresponding to first surfaces of the thermoelectric pellets, second electrodes corresponding to opposite second surfaces of the thermoelectric pellets, and an insulating substrate insulating the first electrodes from each other, the apparatus comprising:
   a fixing tray to which the thermoelectric module can be fixed;
   a guide member detachably mounted in the fixing tray so as to align the thermoelectric pellets in a preset arrangement form;
   a first die comprising a first heating member configured to heat a first adhesive layer, which is interposed between the first surfaces of the thermoelectric pellets and the first electrodes, the fixing tray being mounted on the first die such that the insulating substrate faces the first heating member;
   a second die comprising a second heating member configured to heat a second adhesive layer, which is interposed between the opposite second surfaces of the thermoelectric pellets and the second electrodes, the second die facing the second electrodes; and
   a transfer unit configured to transfer the first die or the second die to adjust a distance between the first die and the second die.

2. The apparatus of claim 1, wherein the transfer unit comprises:
   a cylinder body fixed to one of the first die or the second die; and
   a cylinder rod fixed to the other of the first die and the second die and reciprocally transferred by the cylinder body.

3. The apparatus of claim 1, wherein the second heating member comprises a plurality of heaters each of which is provided to face one of the second electrodes so as to heat the second adhesive layer, and wherein each of the heaters presses the one of the second electrodes as the transfer unit transfers the first die or the second die.

4. The apparatus of claim 3, wherein the second heating member further comprises a plurality of elastic members each of which elastically presses one of the heaters toward the one of the second electrodes.

5. The apparatus of claim 4, wherein the second heating member further comprises a pressing block comprising a plurality of heater insertion grooves that are formed while being spaced apart from each other by a mounting distance between the thermoelectric pellets;
wherein each elastic member is securely mounted in an inner lateral side of one of the heater insertion grooves; and
wherein each heater is inserted into the one of the heater insertion grooves.

6. The apparatus of claim 1, wherein the first heating member is provided to transfer heat corresponding to a melting point of the first adhesive layer to the first adhesive layer through the insulating substrate and the first electrodes; and
wherein the second heating member is provided to transfer heat corresponding to a melting point of the second adhesive layer to the second adhesive layer through the second electrodes.

7. An apparatus for manufacturing a thermoelectric module which comprises thermoelectric pellets, first electrodes corresponding to first surfaces of the thermoelectric pellets, second electrodes corresponding to opposite second surfaces of the thermoelectric pellets, and an insulating substrate insulating the first electrodes from each other, the apparatus comprising:
a fixing unit comprising a fixing tray to which the thermoelectric module can be fixed and a guide member comprising a plurality of guide ribs extending while passing through a space between the thermoelectric pellets, the guide ribs being detachably mounted in the fixing tray;
a first die comprising a first heating member configured to heat a first adhesive layer, which is interposed between the first surfaces of the thermoelectric pellets and the first electrodes, the fixing tray being mounted on the first die such that the insulating substrate faces the first heating member;
a second die comprising a second heating member configured to heat a second adhesive layer, which is interposed between the opposite second surfaces of the thermoelectric pellets and the second electrodes, the second die facing the second electrodes; and
a transfer unit configured to transfer the first die or the second die to adjust a distance between the first die and the second die.

8. The apparatus of claim 7, wherein the first die comprises:
a mounting groove, in which the fixing tray is mounted; and
a guide hole defined to communicate the first heating member with the mounting groove, wherein the first heating member is mounted to correspond to the insulating substrate exposed to an outside through the guide hole.

9. The apparatus of claim 8, wherein the first heating member comprises a laser head configured to heat the first adhesive layer by irradiating a laser beam toward the insulating substrate and, wherein the fixing tray comprises:
an insertion hole bored to communicate the insulating substrate with the first heating member; and
a transmissive window inserted into the insertion hole to support the insulating substrate, the transmissive window formed from a material through which the laser beam can be transmitted.

10. The apparatus of claim 7, wherein the transfer unit comprises:
a cylinder body fixed to one of the first die or the second die; and
a cylinder rod fixed to the other of the first die and the second die and reciprocally transferred by the cylinder body.

11. The apparatus of claim 7, wherein the guide member comprises:
a first guide member comprising a plurality of first guide ribs extending while passing through the space between the thermoelectric pellets in one direction; and
a second guide member comprising a plurality of second guide ribs extending while passing through the space between the thermoelectric pellets in another direction that forms a predetermined angle with the one direction.

12. The apparatus of claim 7, wherein the fixing tray further comprises a plurality of rib grooves into which the guide ribs are inserted, respectively.

13. The apparatus of claim 12, wherein the guide member is separated from the fixing tray when the first and second adhesive layers are heated.

14. The apparatus of claim 7, wherein the second heating member comprises a plurality of heaters each of which is provided to face one of the second electrodes so as to heat the second adhesive layer, and wherein each of the heaters presses the one of the second electrodes as the transfer unit transfers the first die or the second die.

15. The apparatus of claim 14, wherein the second heating member further comprises:
a plurality of elastic members each of which elastically presses one of the heaters toward the one of the second electrodes; and
a pressing block comprising a plurality of heater insertion grooves that are formed while being spaced apart from each other by a mounting distance between the thermoelectric pellets;
wherein each elastic member is securely mounted in an inner lateral side of one of the heater insertion grooves; and
wherein each heater is inserted into the one of the heater insertion grooves.

16. An apparatus for manufacturing a thermoelectric module which comprises thermoelectric pellets, first electrodes corresponding to first surfaces of the thermoelectric pellets, second electrodes corresponding to opposite second surfaces of the thermoelectric pellets, and an insulating substrate insulating the first electrodes from each other, the apparatus comprising:
a fixing tray to which the thermoelectric module can be fixed;
a guide member detachably mounted in the fixing tray so as to align the thermoelectric pellets in a preset arrangement form;
a first die comprising a first heating member configured to heat a first adhesive layer, which is interposed between the first surfaces of the thermoelectric pellets and the first electrodes, the fixing tray being mounted on the first die such that the insulating substrate faces the first heating member, wherein the first die further comprises a mounting groove, in which the fixing tray is mounted, and a guide hole defined to communicate the first heating member with the mounting groove, and wherein the first heating member is mounted to correspond to the insulating substrate exposed to an outside through the guide hole;
a second die comprising a second heating member configured to heat a second adhesive layer, which is interposed between the opposite second surfaces of the thermoelectric pellets and the second electrodes, the second die facing the second electrodes; and a transfer unit configured to transfer the first die or the second die to adjust a distance between the first die and the second die.

17. The apparatus of claim 16, wherein the first heating member comprises a laser head configured to heat the first adhesive layer by irradiating a laser beam toward the insulating substrate.

18. The apparatus of claim 17, wherein the fixing tray comprises:

an insertion hole bored to communicate the insulating substrate with the first heating member; and a transmissive window inserted into the insertion hole to support the insulating substrate, the transmissive window formed from a material through which the laser beam can be transmitted.

19. The apparatus of claim 16, wherein the transfer unit comprises:

a cylinder body fixed to one of the first die or the second die; and a cylinder rod fixed to the other of the first die and the second die and reciprocally transferred by the cylinder body.

20. The apparatus of claim 16, wherein the second heating member comprises a plurality of heaters each of which is provided to face one of the second electrodes so as to heat the second adhesive layer, and wherein each of the heaters presses the one of the second electrodes as the transfer unit transfers the first die or the second die.

* * * * *